United States Patent
Ke et al.

(10) Patent No.: US 7,897,297 B2
(45) Date of Patent: Mar. 1, 2011

(54) METHOD AND SYSTEM FOR OPTIMIZING INTRA-FIELD CRITICAL DIMENSION UNIFORMITY USING A SACRIFICIAL TWIN MASK

(75) Inventors: Chih-Ming Ke, Hsin-Chu (TW);
Tsai-Sheng Gau, Hsin-Chu (TW);
Shinn-Sheng Yu, Hsinchu (TW);
Hung-Chang Hsieh, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 346 days.

(21) Appl. No.: 11/763,269

(22) Filed: Jun. 14, 2007

(65) Prior Publication Data

US 2007/0292774 A1 Dec. 20, 2007

Related U.S. Application Data

(63) Continuation-in-part of application No. 11/455,982, filed on Jun. 20, 2006.

(51) Int. Cl.
*G03F 1/00* (2006.01)

(52) U.S. Cl. .............................. 430/5; 430/30; 430/311

(58) Field of Classification Search ..................... 430/5, 430/22, 30, 394; 716/19, 21
See application file for complete search history.

(56) References Cited

U.S. PATENT DOCUMENTS

| | | | |
|---|---|---|---|
| 6,835,507 B2 * | 12/2004 | Ki et al. ........................ | 430/5 |
| 7,234,128 B2 | 6/2007 | Gau et al. | |
| 7,566,181 B2 | 7/2009 | Yang et al. | |
| 2003/0104319 A1 * | 6/2003 | Lin et al. ..................... | 430/313 |
| 2003/0180632 A1 * | 9/2003 | Eurlings et al. ............... | 430/5 |
| 2004/0063038 A1 * | 4/2004 | Shin et al. .................... | 430/311 |
| 2005/0136341 A1 * | 6/2005 | Park et al. ..................... | 430/5 |
| 2005/0196684 A1 * | 9/2005 | Nakamura et al. ............. | 430/5 |
| 2006/0134532 A1 * | 6/2006 | Ogawa et al. ................. | 430/5 |
| 2006/0196960 A1 | 9/2006 | Yu et al. | |
| 2006/0222975 A1 | 10/2006 | Ke et al. | |

(Continued)

FOREIGN PATENT DOCUMENTS

JP 2006-154404 A 6/2006

(Continued)

OTHER PUBLICATIONS

Ke, Chih-Ming, et al., "Evaluation of Line and Hole Measurement by High-Resolution/Low-Magnification CD SEM", Proceedings of SPIE, vol. 5752, May 2005, pp. 1292-1299.

(Continued)

*Primary Examiner*—Mark F Huff
*Assistant Examiner*—Stewart A Fraser
(74) *Attorney, Agent, or Firm*—Haynes and Boone, LLP

(57) ABSTRACT

Disclosed is a method and a system for optimizing intra-field critical dimension of an integrated circuit. A first mask for an integrated circuit is provided comprising at least one device region. A second mask is provided by copying the first mask and a lithography operation is provided to the integrated circuit using the first and second masks, wherein the critical dimension of the integrated circuit is optimized using the second mask. The second mask comprises a plurality of sacrificial patterns, which may be a plurality of flat patterns or a plurality of grating patterns.

18 Claims, 15 Drawing Sheets

U.S. PATENT DOCUMENTS

2007/0292771 A1 * 12/2007 Ke et al. .................. 430/5

FOREIGN PATENT DOCUMENTS

| JP | 2006154404 | 6/2006 |
|---|---|---|
| TW | I251865 | 10/2003 |
| TW | 200618046 | 9/2004 |

OTHER PUBLICATIONS

Ke, Chih-Ming, et al., "90nm Lithography Process Characterization Using ODP Scatterometry Technology", Proceedings of SPIE, vol. 5375, May 2004, pp. 597-604.

Taiwanese Patent Office, Office Action dated Dec. 11, 2009, Application No. 09820799760, 5 pages.

Chinese Patent Office, Chinese Office Action mailed Jul. 7, 2010, Application No. 200710111439.1; 4 pages.

* cited by examiner

OD layer pattern
(1st layer pattern)

Poly layer pattern
(2nd layer pattern)

US 7,897,297 B2

METHOD AND SYSTEM FOR OPTIMIZING INTRA-FIELD CRITICAL DIMENSION UNIFORMITY USING A SACRIFICIAL TWIN MASK

RELATED APPLICATION

This application is a continuation-in-part of U.S. application Ser. No. 11/455,982 filed Jun. 20, 2006, which is hereby incorporated by reference.

BACKGROUND

The present disclosure relates in general to integrated circuit manufacturing, and more particularly to a system and method to optimize critical dimension uniformity in manufacturing of integrated circuits by using a sacrificial twin mask.

In integrated circuit manufacturing technology, a resist layer is typically applied to a semiconductor wafer surface, followed by an exposure of the resist through a mask (e.g., a reticle or photomask). A post-exposure baking process is then performed to alter physical properties of the resist for subsequent processing. An after-development inspection (ADI) is then performed to inspect the critical dimension (CD) and profile of the exposed resist using a scanning electron microscope (SEM) to determine whether it conforms to a specification. If the resist is within specification, a pattern is etched or transferred and the resist is stripped. An after-etching inspection (AEI) is then performed on the wafer.

Traditional SEM inspection, however, becomes a bottleneck for providing accurate and repeatable CD and profile analysis due to electron charging effects that not only limit the accuracy and repeatability of CD metrology, but also cause damage at the measurement area. In response, an optical critical dimension (OCD) method is often used instead of SEM inspection. OCD can detect CD information including CD profile and wafer film thickness. OCD also has much less noise than SEM and the sampling ratio of OCD is more accurate than the sampling ratio of SEM. Thus, OCD provides more consistent and comprehensive CD information than SEM.

Both SEM and OCD may be used in after-development inspection and after-etching inspection to optimize CD uniformity. With existing SEM and OCD tools, inter-field critical dimension uniformity may be optimized. Inter-field CD uniformity optimization may be obtained by examining the die-to-die CD difference between a plurality of dies on a wafer. For example, inter-field CD uniformity optimization may be performed over 80 die to improve the quality of selected measurement points of a wafer surface area.

In addition to inter-field optimization, intra-field CD uniformity optimization may be performed with existing SEM and OCD tools. Intra-field CD uniformity optimization may be performed by examining CD differences within a die or field of the wafer. However, due to the large grating size of an OCD pattern, such as 60×60 um, the OCD pattern may not distribute uniformly in the chip and the sampling size is limited. In addition, the OCD pattern may not be used on some devices, such as a static random access memory (SRAM) cell. Thus, intra-field CD uniformity optimization is limited by the location of the OCD pattern and the number of OCD samplings that can be performed by a scanner.

Therefore, a need exists for a method and system for optimizing intra-field CD uniformity, such that intra-field CD uniformity optimization is not limited by the grating size or the location of device regions.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion. It is also emphasized that the drawings appended illustrate only typical embodiments of this invention and are therefore not to be considered limiting in scope, for the invention may apply equally well to other embodiments.

DETAILED DESCRIPTION

Figure 1:
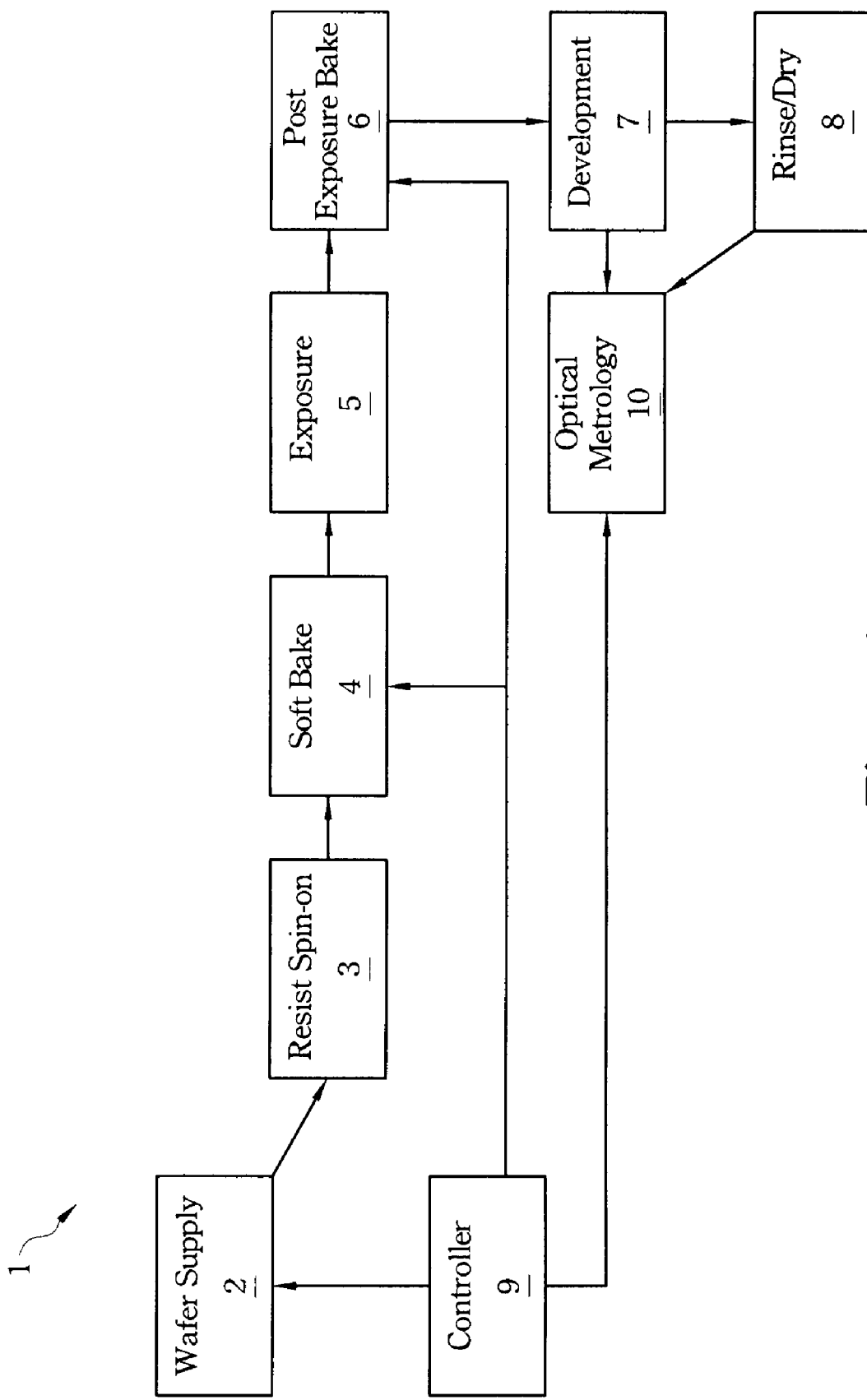
FIG. 1 is a diagram illustrating an exemplary lithography process track in which aspects of the present disclosure may be implemented.

For the purposes of promoting an understanding of the principles of the invention, reference will now be made to the embodiments, or examples, illustrated in the drawings and specific language will be used to describe the same. It will nevertheless be understood that no limitation of the scope of the invention is thereby intended. Any alterations and further modifications in the described embodiments, and any further applications of the principles of the invention as described herein are contemplated as would normally occur to one skilled in the art to which the invention relates. Furthermore, the depiction of one or more elements in close proximity to each other does not otherwise preclude the existence of intervening elements. Also, reference numbers may be repeated throughout the embodiments, and this does not by itself indicate a requirement that features of one embodiment apply to another embodiment, even if they share the same reference number.

Aspects of the present disclosure provide a method and system for optimizing intra-field CD uniformity by using a sacrificial twin mask. In an illustrative embodiment, a sacrificial twin mask is provided by making a copy of the original mask provided by the customer. The sacrificial twin mask comprises a mask that includes a plurality of sacrificial patterns. In one embodiment, the plurality of sacrificial patterns is a plurality of regular or repeating grating-like patterns, such as OCD grating patterns. In an alternative embodiment, the plurality of sacrificial patterns is a plurality of flat dummy patterns. The plurality of flat sacrificial patterns may be positioned over device regions of an integrated circuit. By providing a sacrificial twin mask having a plurality of sacrificial patterns, intra-field CD uniformity may be optimized without the limitations that normally result from OCD grating size and sampling size.

Referring to FIG. 1, an exemplary lithography process track 1 includes wafer supply racks 2, a resist spin-on station 3, a soft bake station 4, an exposure station 5, a post exposure bake station 6, a development station 7 and a rinse/dry station 8. A controller 9 automates the lithography process track 1 by communication with wafer supply racks 2, soft bake station 4, post exposure bake station 5 and optical metrology station 10.

Process wafers are first supplied by wafer supply racks 2 to the resist spin-on station 3 to coat the resist on a wafer surface. The wafer is then soft-baked at the soft-bake station 4 and transferred to the exposure station 5 to expose the wafer. Afterwards, a post-exposure bake is performed on the wafer at the post-exposure baking station 6 and the wafer is transferred to the development station 7. After development, the wafer may either be immediately transferred to an optical metrology station 10 or subjected to a rinse/dry at station 8 prior to being transferred to the optical metrology station 10. The optical metrology station 10 includes a spectrometer for collecting spectra of scattered light from the resist in a digital format. The controller 9 processes the collected spectra of scattered light and performs a diffraction analysis. Aspects of the present disclosure may be implemented within the controller 9 or optical metrology station 10 or other parts of the lithography process track 1 without departing the spirit and scope of the present disclosure.

Figure 2:
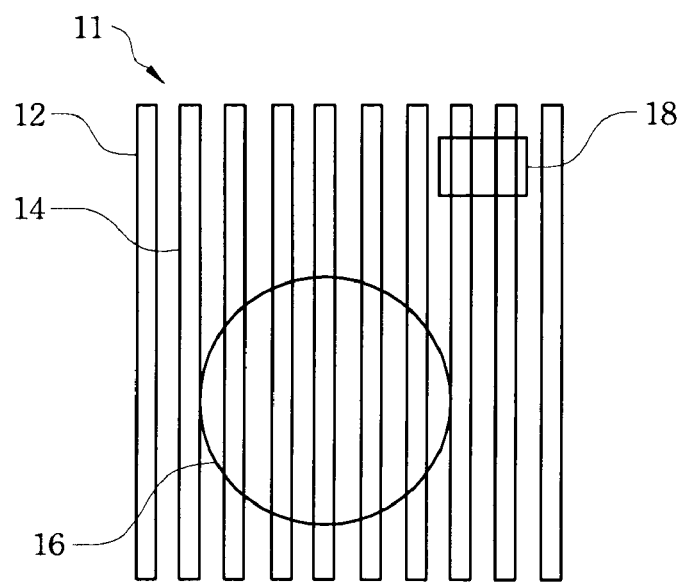
FIG. 2 is a diagram illustrating an exemplary portion of resist grating.

Referring to FIG. 2, a resist grating 11 is formed when a test process wafer is passed through the lithography track process 1 to form a resist pattern. For example, resist lines 12 and 14 are formed having a predetermined line width and pitch. Area 16 refers to an exemplary probe spot size for incident light from which scattered light spectra is collected using an optical critical dimension (OCD) based scatterometry. OCD based scatterometry collects one or more scattered spectra from the resist grating 11 and performs diffraction analysis to provide uniformity measurements and additional information. The additional information includes sidewall angle, resist thickness, ARC layer thickness, and under-layer film thickness. In this example, area 16 is about 50 um×50 um. Area 18 refers to an exemplary probe spot size by SEM for determining CD variation. In this example, area 18 has a field of view (FOV) of about 150K magnification and is about 1 um×1 um. Thus, the measurement box size of OCD using OCD scatterometry is about 50 um×50 um while the measurement box size of the SEM is about 1 um×1 um. The sampling ratio of OCD to SEM is greater than 2500 times.

Figure 3A:
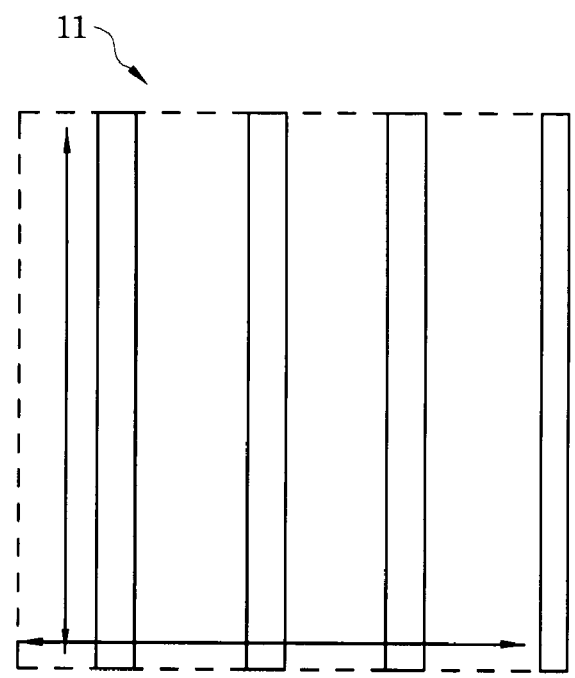
FIGS. 3A & 3B are diagrams illustrating different scanning methodologies of SEM.
Figure 3B:
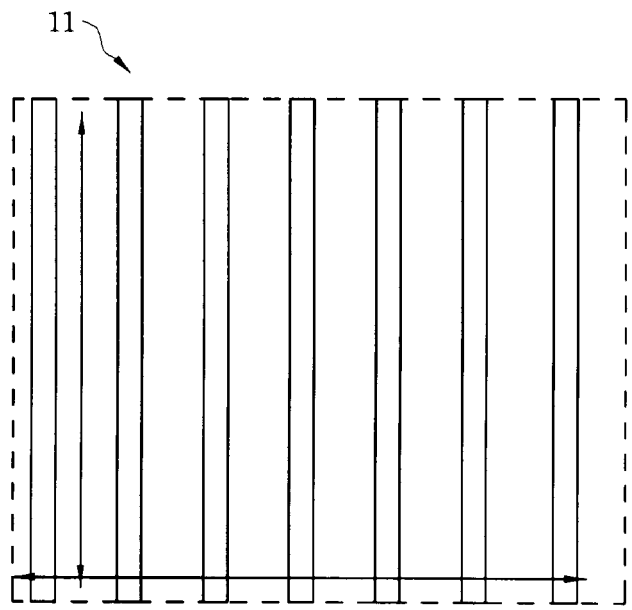

Referring to FIG. 3A, a standard scan single line measurement of resist grating 11 with 150K magnification is shown. In this example, the sampling size is one line. With such a small sampling size, CD uniformity may not be fully represented. In FIG. 3B, an average line width (ALW) measurement of resist grating 11 with 35K magnification is shown. ALW measurement enlarges the field of view (FOV) and allows for multiple line measurements. Multiple line measurements increase sampling number and reduce CD error without sacrificing throughput. In this example, the sampling size is seven lines. Greater sampling size means more sampling points. With more sampling points, CD or CDU values would converge to a statistical true value. In this example, a six sampling point CD average is used as the SEM CD standard, because more than 30 sampling points as required by the standard scan for each measurement location is not practical.

Figure 4:
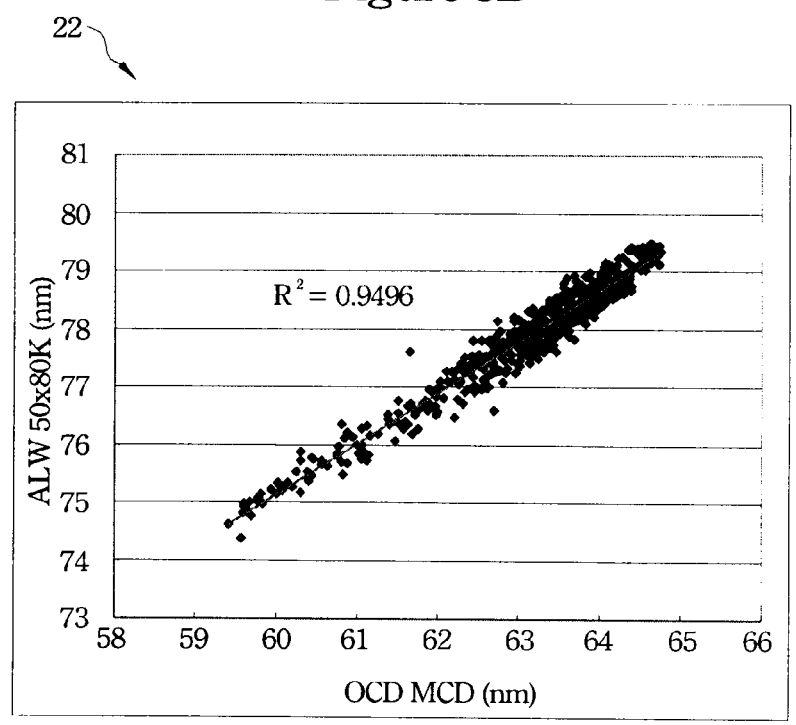
FIG. 4 is a diagram illustrating a graph of sampling effect on CD correlations between average line width (ALW) measurement with 35K magnification and OCD.

Referring to FIG. 4, a diagram illustrating a graph of sampling effect on CD correlations between ALW measurement with 80K×35K x-y magnification and OCD is depicted. CD correlation is a function of sampling size and sampling methodology. The Y-axis of graph 22 represents CD measurements of ALW measurement with 80K×35K x-y magnification. The X-axis of graph 22 represents CD measurements of OCD. In this example, the CD correction ($R^2$) is about 0.9496. Thus, CD measurements of ALW measurement with 80K×35K x-y magnification are very close to OCD measurements, which means that the six sampling point average SEM CD standard is almost as CD sensitive as OCD. In comparison to standard CD SEM measurement 150K×150K x-y magnification, low magnification, such as 80K×35K x-y magnification, CD SEM measurement may reduce the line edge roughness effect on the CD mean.

As discussed above, good CD measurement data or metrology and large sampling size provide better CD uniformity. However, the large grating size of OCD pattern becomes an obstacle both in terms of sampling limit and sampling location.

Figure 5:
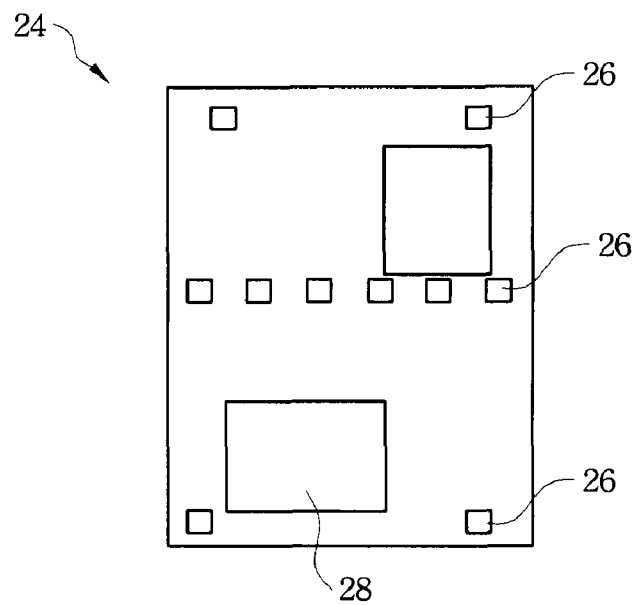
FIG. 5 is a diagram illustrating an exemplary OCD grating.

Referring to FIG. 5, a diagram illustrating an exemplary OCD grating is depicted. In this example, a mask 24 is provided with OCD grating pattern 26. Due to the large grating pattern size of 60 um×60 um, the OCD grating pattern 26 does not distribute uniformly in the mask 24 and the sampling size is also limited. For example, only ten OCD samplings may be performed. In addition, the OCD grating pattern 26 may not be inserted onto devices such as SRAM cell 28.

Since an ALW measurement with 80K×35K x-y -magnification provides CD uniformity that is close to OCD, a dummy grating pattern for an ALW measurement by SEM may also be used to optimize CD uniformity.

Figure 6:
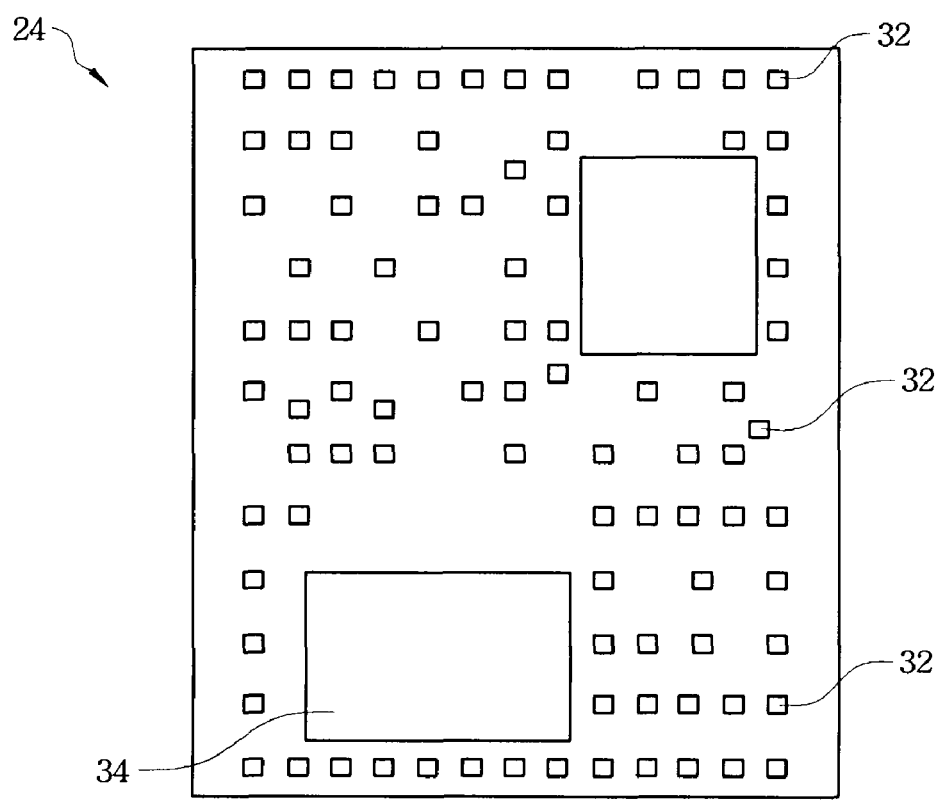
FIG. 6 is a diagram illustrating an exemplary dummy grating pattern.

Referring to FIG. 6, a diagram illustrating an exemplary dummy grating pattern is depicted. In this example, mask 24 is provided with a dummy grating pattern 32 for ALW measurement by SEM. The size of the dummy grating pattern 32 is about 5 um×5 um. Therefore, more sampling may be performed. For example, 80-100 samplings may be performed. However, similar to OCD grating pattern 26, dummy grating pattern 32 also may not be inserted onto devices such as SRAM cell 34.

Figure 7:
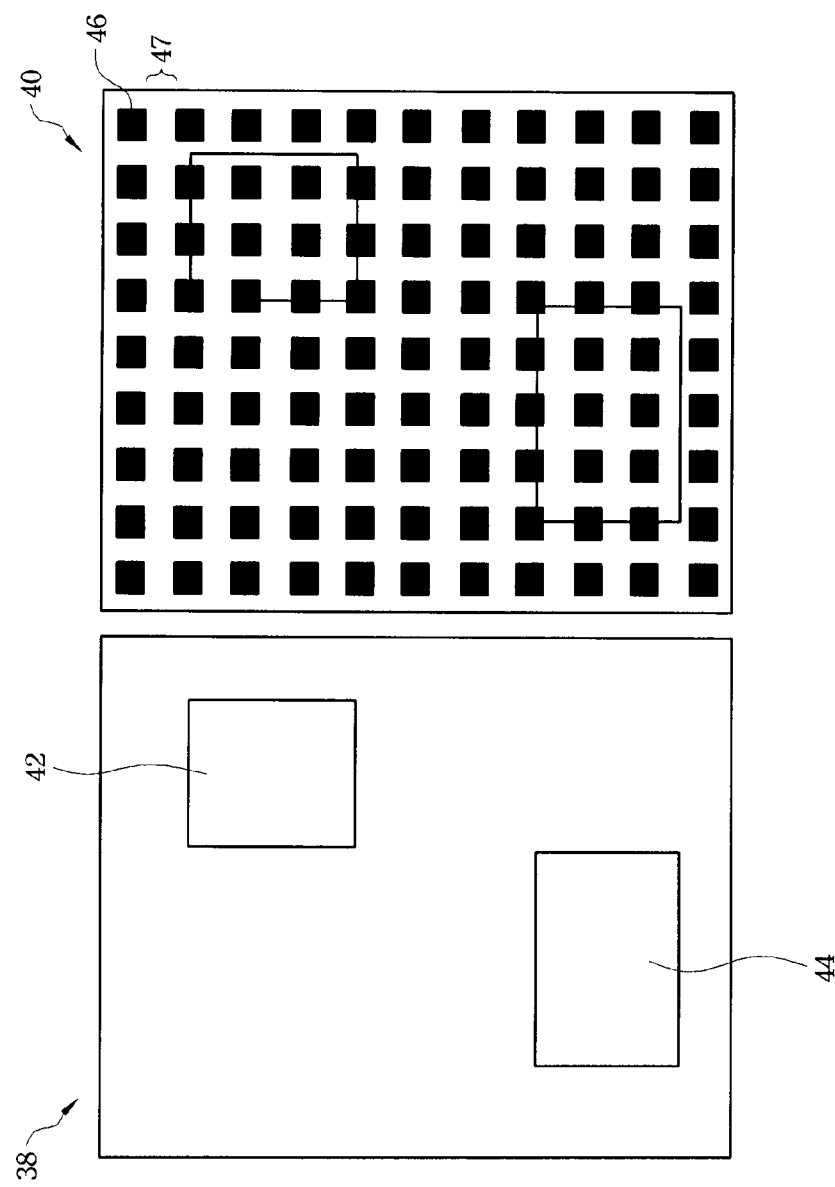
FIG. 7 is a diagram illustrating an exemplary sacrificial twin mask.

For any shortcomings of the above patterns, a sacrificial twin mask provides both larger sampling size and advantages of OCD grating or ALW dummy patterns. Referring to FIG. 7, a diagram illustrating an exemplary sacrificial twin mask is depicted. Customer mask 38 comprises a layout of a plurality of device regions. Sacrificial twin mask 40 is a copy of the customer mask 38. The quality of sacrificial twin mask 40 is substantially the same as the customer mask 38. In this example, customer mask 38 comprises a layout of device regions 42 and 44. Device regions 42 and 44 may be regions for devices to be patterned on the substrate, for example, a SRAM cell.

Sacrificial twin mask 40 comprises a plurality of sacrificial patterns 46. In an illustrative embodiment, the plurality of sacrificial patterns 46 may be implemented as a plurality of grating like or repeating pattern, such as OCD grating pattern 26. Alternatively, the plurality of sacrificial patterns 46 may be implemented as a plurality of dummy grating patterns, such as dummy grating pattern 32. As shown in FIG. 7, the plurality of sacrificial patterns 46 are substantially symmetrical to one another and are uniformly distributed over the sacrificial twin mask 40. In one example, each of the plurality of sacrificial patterns 46 has a dimension of 3 um ×3 um with an area of about 9 um². In another example, each of the plurality of sacrificial patterns 46 has a dimension of 70 um×70 um with an area of about 4900 um².

In addition, a spacing 47 is present between the plurality of sacrificial patterns 46. Spacing 47 is independent of OCD grating size. In this example, the spacing 47 in the sacrificial mask 40 is 1000 um. In order to reduce the interference between the plurality of sacrificial patterns 46 due to optical or etch loading effect, the dimension of spacing 47 is large in comparison to the dimension of the plurality of sacrificial pattern 46. Since the plurality of sacrificial patterns 46 are OCD or dummy grating like, the plurality of sacrificial patterns 46 have some advantages of the OCD or dummy patterns. For example, global CD uniformity may be optimized using the plurality of sacrificial patterns 46 that are dummy like, which allows for larger sampling size due to the small grating size of dummy patterns. In addition, more consistent and better CD measurement data may be obtained from the plurality of sacrificial patterns 46 that are like OCD gratings. Furthermore, the limitation of OCD pattern location may be eliminated, because the plurality of sacrificial patterns 46 in the sacrificial twin mask 40 may now overlap device regions 42 and 44.

Figure 8A:
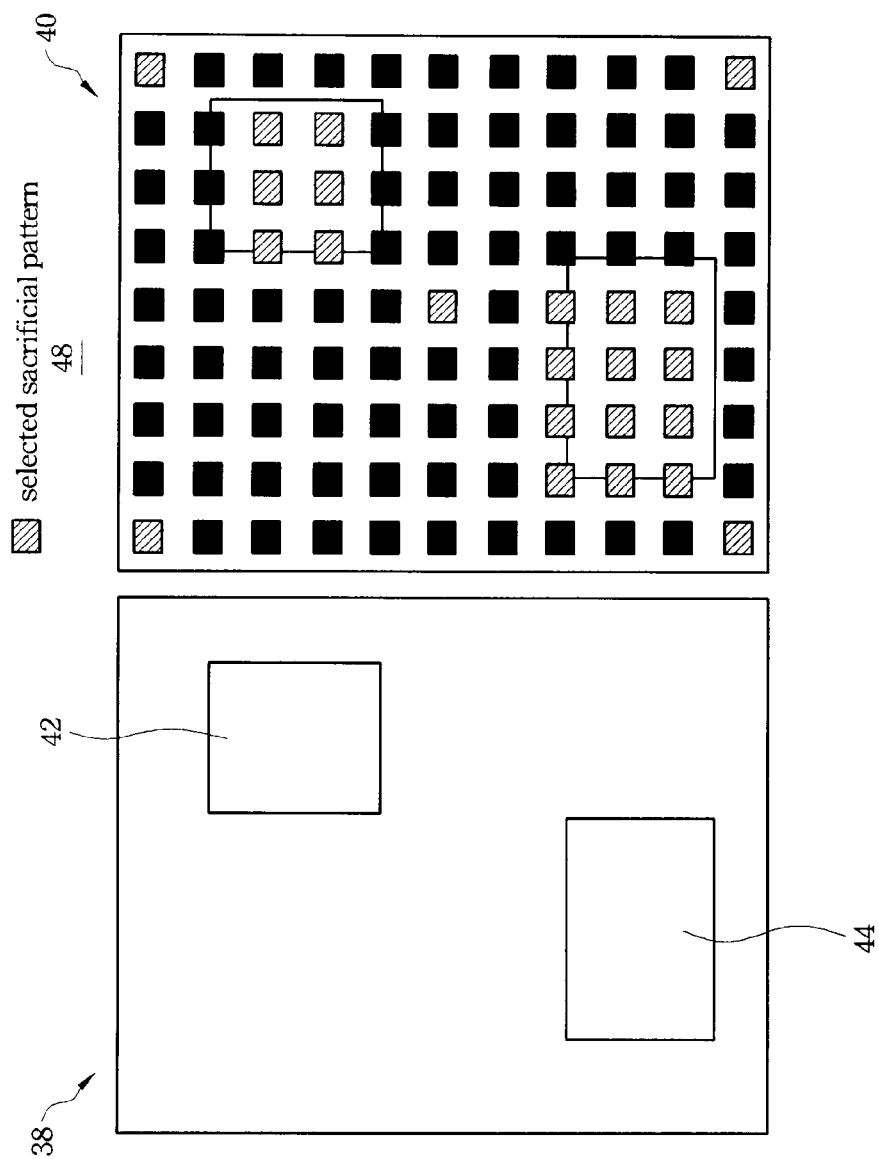
FIGS. 8A-8C are diagrams illustrating exemplary local selective CD uniformity optimizations.
Figure 8B:
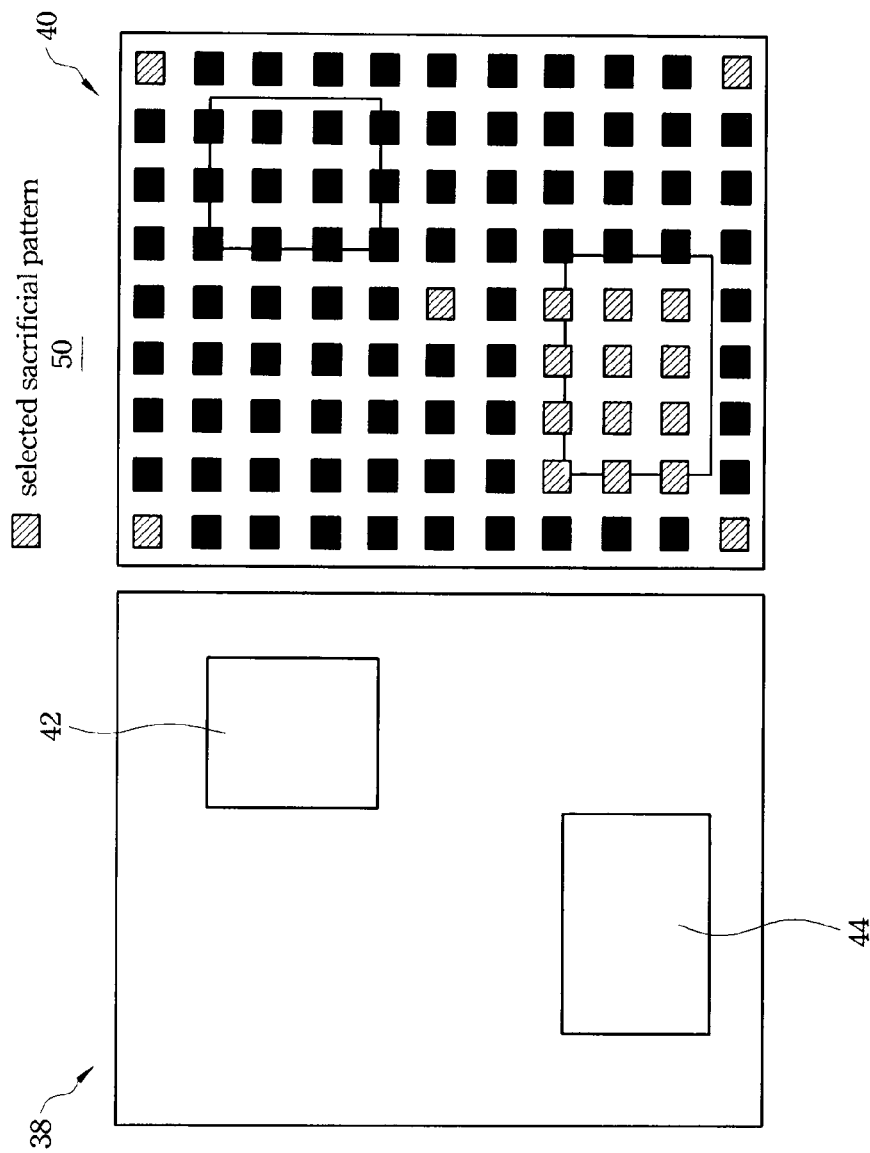
Figure 8C:
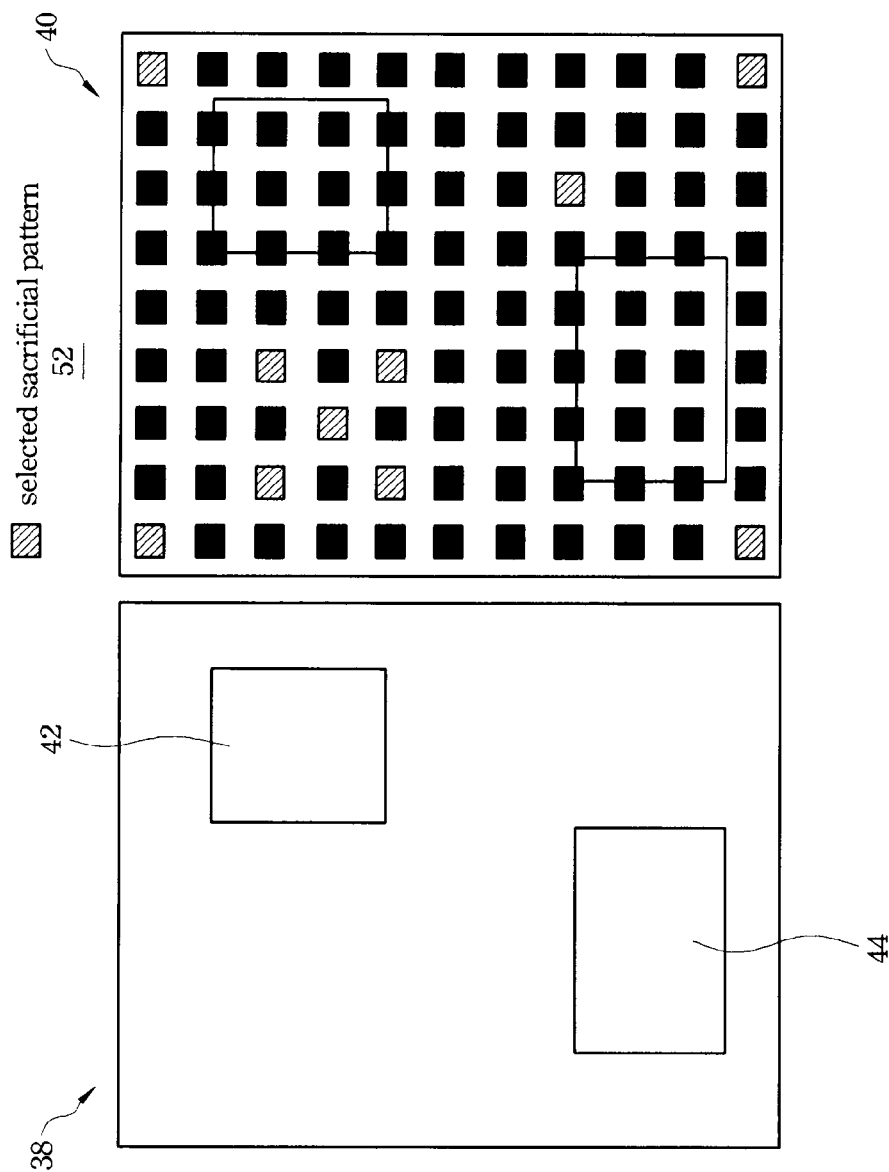

In addition to global optimization of CD uniformity, local selective CD uniformity optimization may be performed with the plurality of sacrificial patterns 46. Referring to FIGS. 8A-8C, diagrams illustrating exemplary local selective CD uniformity optimizations are depicted. In FIG. 8A, a plurality of sacrificial patterns are selected from sacrificial twin mask 40 for sampling. In this example, the plurality of selected sacrificial patterns 48 are located at four corners of the sacrificial twin mask 40, the center of the sacrificial twin mask 40, a plurality of selected sacrificial patterns 48 overlapping device region 42 and a plurality of selected sacrificial patterns 48 overlapping device region 44.

In FIG. 8B, a plurality of sacrificial patterns 50 are selected from sacrificial twin mask 40 for sampling. In this example, the plurality of selected sacrificial patterns 50 are located at four corners of the sacrificial twin mask 40, the center of the sacrificial twin mask 40, and a plurality of sacrificial patterns 50 overlapping device region 44. In FIG. 8C, a plurality of sacrificial patterns 52 are selected from sacrificial twin mask 40 for sampling. In this example, the plurality of selected sacrificial patterns 52 are located at four corners of the sacrificial twin mask 40, a plurality of sacrificial patterns outside of device regions 42 and 44. By allowing the selection of local sacrificial patterns 48, 50, and 52, CD measurements may be obtained for the local selective patterns and CD uniformity optimization may be performed on only those local selective patterns. In this way, the performance of intra-field CD uniformity optimization may be improved.

Figure 9:
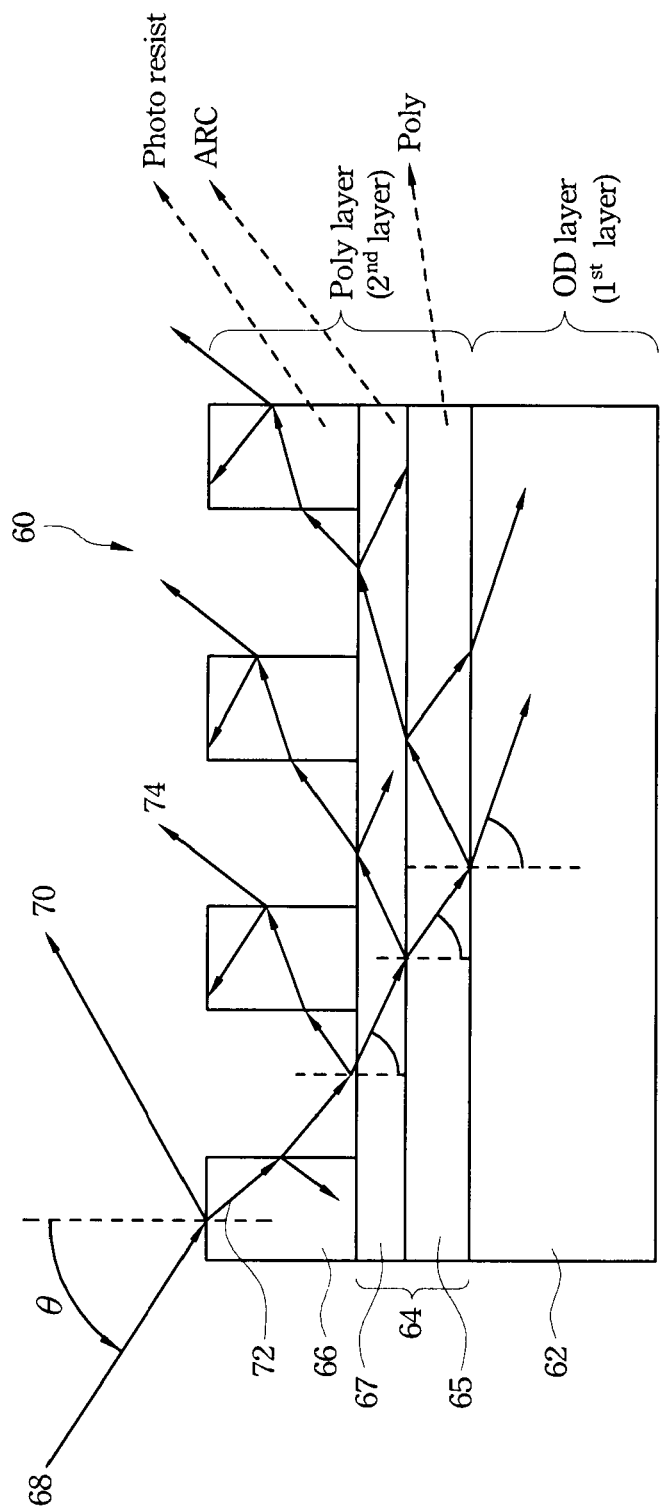
FIG. 9 is a diagram illustrating an exemplary process wafer subjected to optical critical dimension (OCD) based scatterometry.

As discussed above, OCD based scatterometry is used to collect one or more scattered spectra from the resist grating 11 and perform diffraction analysis such that uniformity measurements and additional information may be gathered. Referring to FIG. 9, a diagram illustrating an exemplary process wafer subjected to optical critical dimension (OCD) based scatterometry is depicted. Wafer 60 comprises a first layer 62 and a second layer 64. The first layer 62 may comprise a substrate made of silicon or polysilicon. The first layer is also referred to as an OD layer. The second layer 64 may comprise a poly layer 65, an antireflective layer 67, and a patterned resist layer 66. The poly layer 65 may include silicon dioxide. The patterned resist layer 66 may include material such as $Si_3N_4$.

Incident light 68 from a probing light source of a spectrometer may be directed to a probe area of the resist layer 66 forming an incident angle Θ of between 30 to 90 degrees with respect to the resist surface. A portion 70 of the incident light 68 is scattered from the surface of resist layer 66 after passing through resist portion 72 to produce detectable scattered light 74, Scattered light 74 is collected by a conventional detector, such as a diode array detector, at different wavelengths, A diffraction analysis is then performed on scattered light 74 to obtain three dimensional information and other additional information of the resist layer 66.

In order for OCD scatterometry to collect scattered light from resist layer 66, the OCD scatterometry uses regular or repeating patterns on the first layer 62. Any irregular pattern on the first layer 62 will disturb the OCD reflecting signal and OCD modeling. Thus, a second layer repeating-pattern grating overlying any irregular patterns of the first layer 62 may not be measured by the detector. In some customer-provided masks, however, the patterns of the first layer 62 are irregular.

Figure 10:
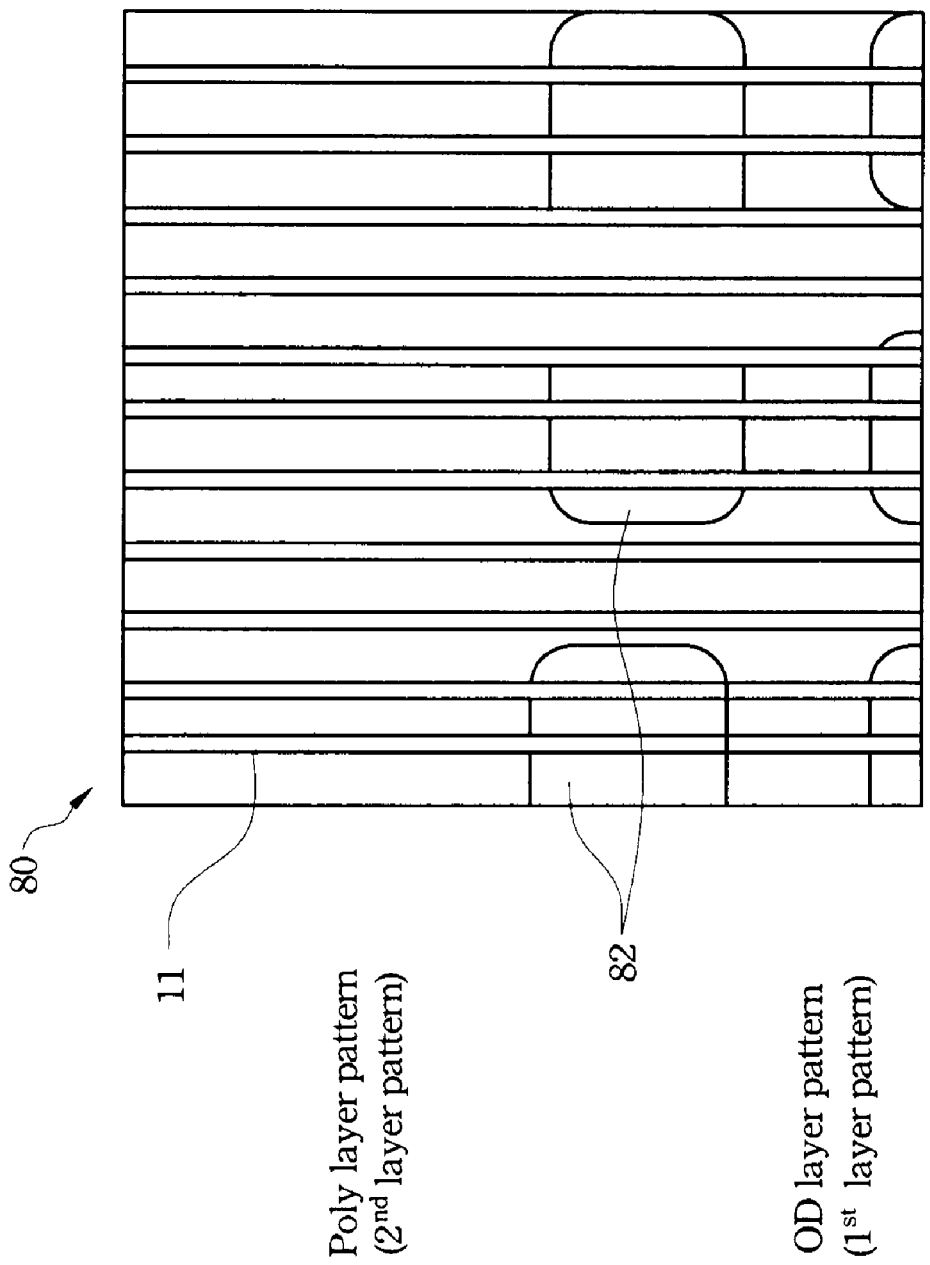
FIG. 10 is a diagram illustrating a customer provided mask comprising irregular or non-repeating patterns.

Referring to FIG. 10, a diagram illustrating a customer provided mask comprising irregular or non-repeating patterns is depicted. Customer provided mask 80 comprises resist grating 11 in the second layer 64 and a plurality of irregular patterns 82 in first layer 62. The plurality of irregular patterns 82 in the first layer 62 prevent the second layer repeating-pattern grating from being measured, which leads to the failure of the second layer intra-field CD uniformity metrology or data requirement.

Figure 11:
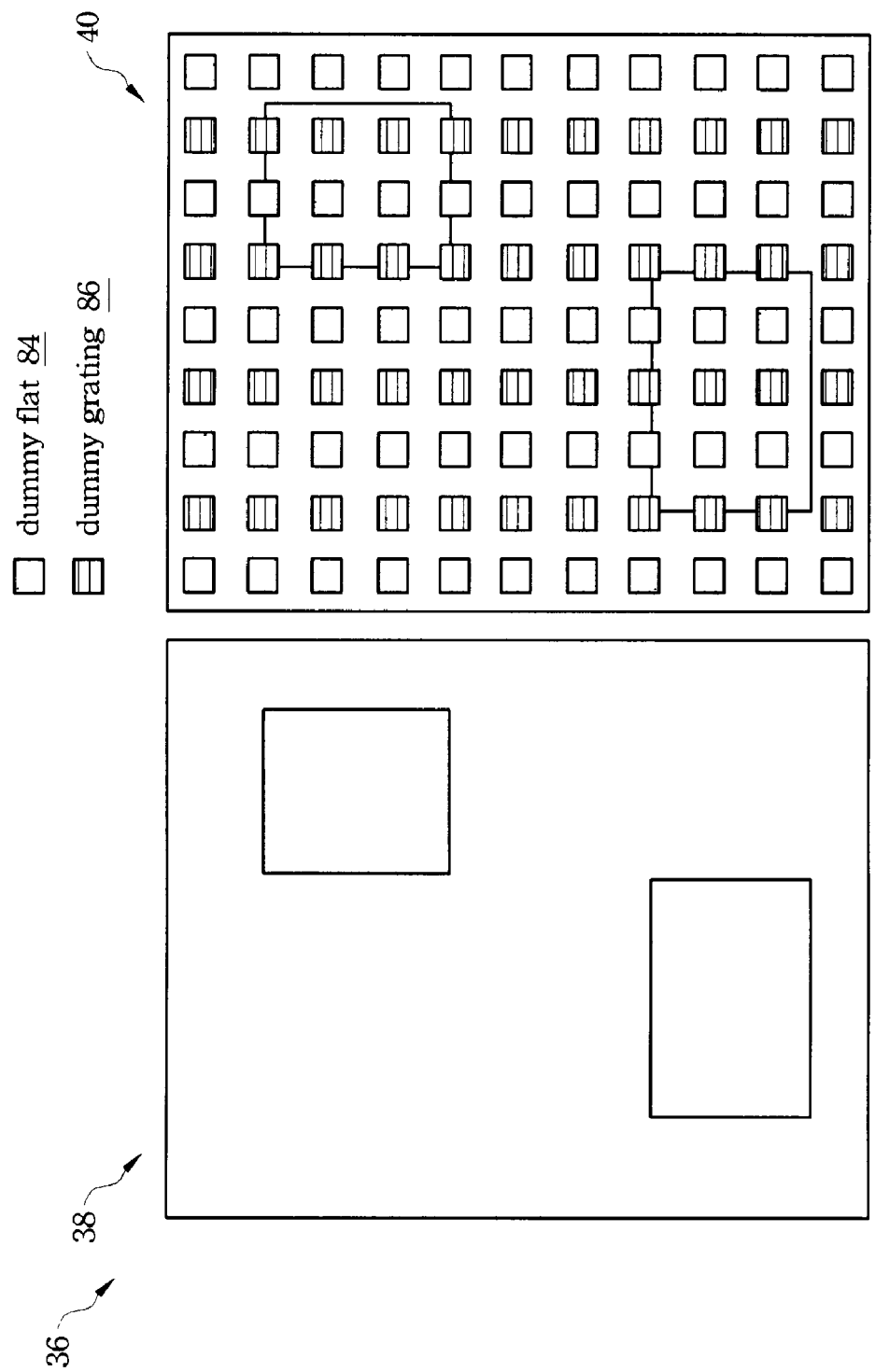
FIG. 11 is a diagram illustrating one embodiment of the sacrificial twin mask for CDU optimization in a first layer.

The sacrificial twin mask of the present disclosure may be used to correct the problem of irregular patterns in the material layer. Referring to FIG. 11, a diagram illustrating one embodiment of the sacrificial twin mask for CDU optimization in the first layer is depicted. In the sacrificial twin mask 40, a first plurality of sacrificial patterns and a second plurality of sacrificial patterns are present in the first layer 62. The first plurality of sacrificial patterns are dummy flat patterns 84. The second plurality of sacrificial patterns are dummy grating patterns 86.

The dummy flat patterns 84 provide flat areas to clear out the irregular patterns 82 in the first layer 62 exactly below the second layer repeating-pattern grating, such that the second layer repeating-pattern grating may be measured and the second layer intra-field CD uniformity metrology requirement may be satisfied. While the dummy flat patterns 84 are preferably implemented in the first layer 62, the dummy flat patterns 84 may be implemented at any other layer, including the second layer, or other layers, to provide flat areas for irregular patterns, without departing the spirit and scope of the present disclosure. Dummy grating patterns 86, on the other hand, are regular or repeating patterns, which enable the first layer resist grating CD data to be measured and the first layer intra-field CDU to be optimized.

Figure 12:
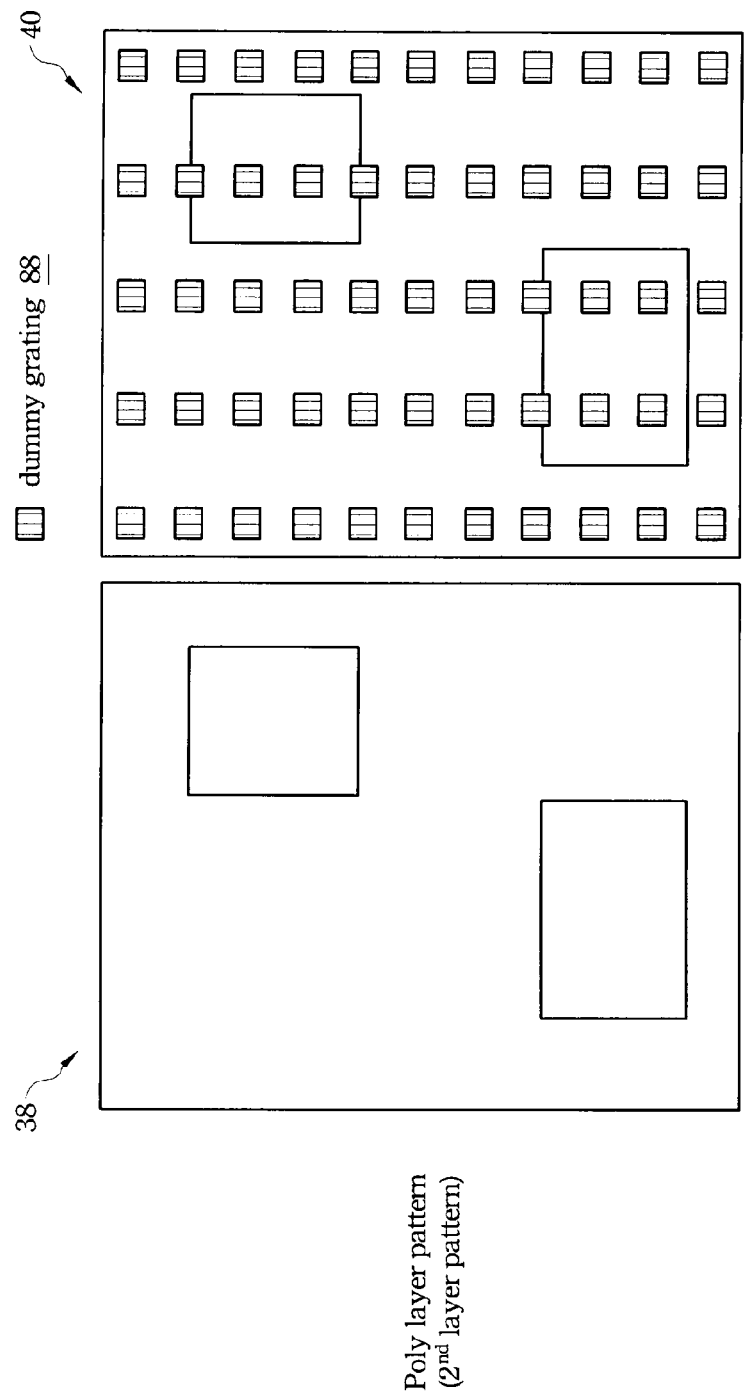
FIG. 12 is a diagram illustrating another embodiment of the sacrificial twin mask for CDU optimization in a second layer.

Referring to FIG. 12, a diagram illustrating another embodiment of the sacrificial twin mask for CDU optimization in the second layer 64 is depicted. In the sacrificial twin mask 40, a plurality of sacrificial patterns are present in the second layer 64. The plurality of sacrificial patterns are referred to as a dummy grating 88. The dummy grating 88 provides grating-like or repeating patterns. The dummy grating 88 may be used to measure second layer resist grating and optimize second layer intra-field CDU.

Figure 13:
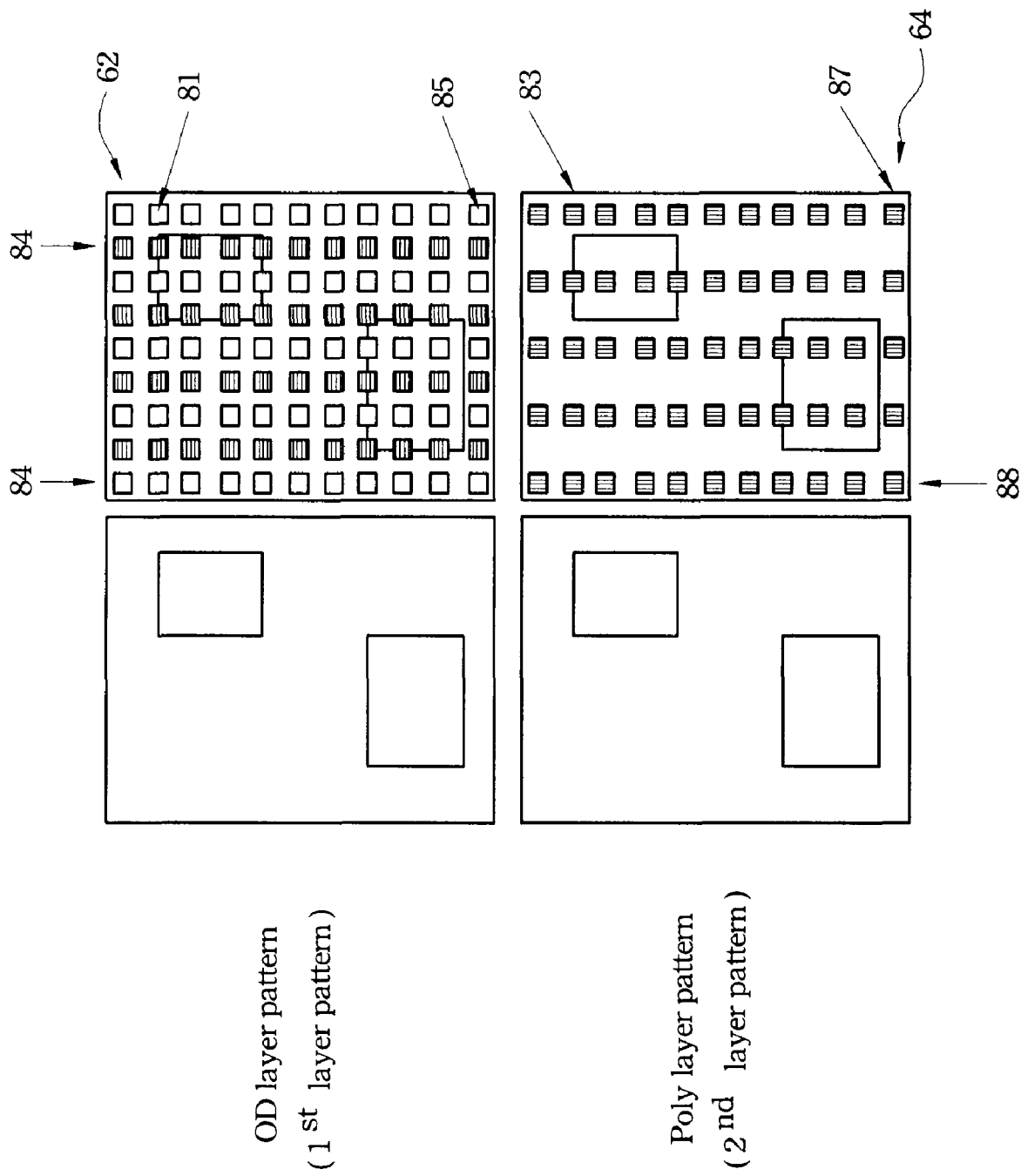
FIG. 13 is a diagram illustrating a combination of the sacrificial twin masks in the first layer and the second layer.

Referring to FIG. 13, a diagram illustrating a combination of the sacrificial twin masks in the first layer and the second layer is depicted. In the first layer 62, the dummy flat pattern 84 provides flat areas to clear out the irregular patterns 82 in the first layer 62 exactly below the dummy grating 88 of the second layer 64. In this example, the dummy flat pattern 81 in the first layer 62 provides a flat area to clear out the irregular pattern 82 in the first layer 62 exactly below the dummy grating 83 in the second layer 64. Similarly, dummy flat pattern 85 in the first layer 62 provides a flat area to clear out the irregular pattern 82 in the first layer 62 exactly below the dummy grating 87 in the second layer 64.

Figure 14:
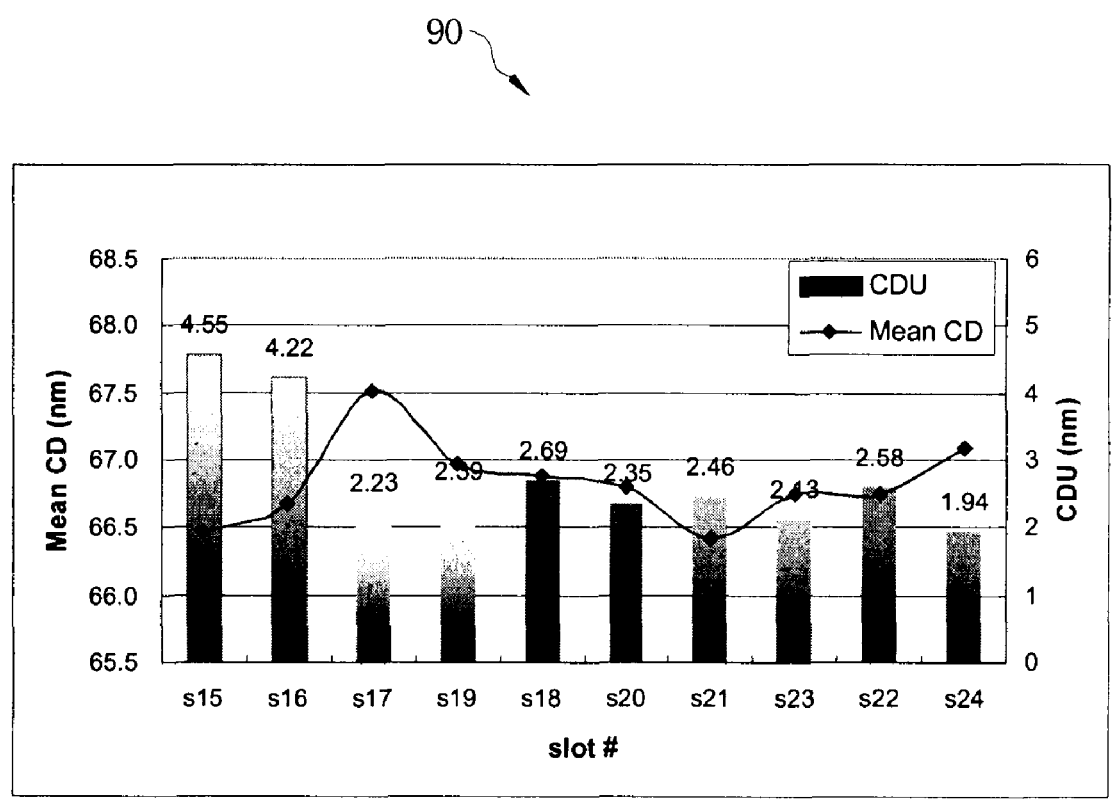
FIG. 14 is a graph of inter and intra CD uniformity optimization for the second layer using a sacrificial twin mask.

Referring to FIG. 14, a graph 90 of inter and intra CD uniformity optimization for the second layer using sacrificial twin mask is depicted. The Y-axis of graph 90 for the bars indicates CD uniformity (3× sigma) of the second layer in nm. The X-axis of graph 90 indicates the slot number of the wafers. In this example, prior to CDU optimization using the sacrificial twin mask, the CDU is 4.22 nm, as evidenced in the CDU of slot 16. With the advantages of sacrificial twin mask of the present disclosure, CDU is optimized to 1.94 nm as evidenced by the CDU of slot 24. Thus, both the inter and intra-field CDU is optimized for the second layer with the use of sacrificial twin mask.

Figure 15:
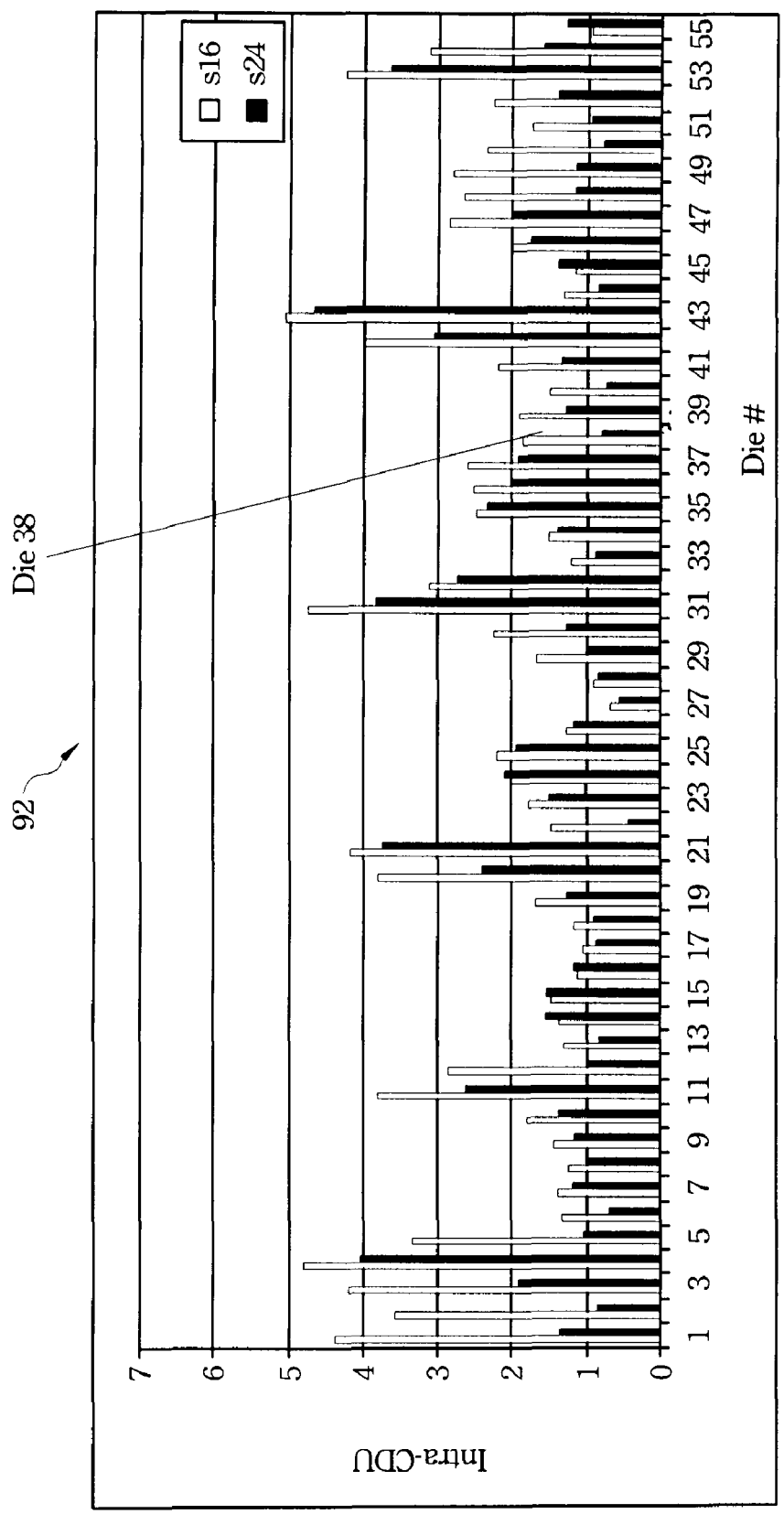
FIG. 15 is a graph of intra CD uniformity optimization for the second layer using a sacrificial twin mask.

Referring to FIG. 15, a graph 92 of intra CD uniformity optimization for the second layer using sacrificial twin mask is depicted. The Y-axis of graph 92 indicates the intra-field CDU of the second layer in nm. The X-axis indicates the die numbers within a wafer. In this example, prior to CDU optimization using sacrificial twin mask, the intra-field CDU of die 38 is 1.84 nm, as evidenced by the CDU of slot 16. With the advantages of sacrificial twin mask of the present disclosure, the CDU of die 38 is optimized to 0.79 nm as evidenced by the CDU of slot 24. Thus, the intra-field CDU is optimized for the second layer with the use of sacrificial twin mask.

In summary, aspects of the present disclosure provide a sacrificial twin mask for optimizing intra-field CD uniformity. The sacrificial twin mask comprises a plurality of sacrificial patterns. The plurality of sacrificial patterns may include grating like patterns or dummy patterns. Aspects of the present disclosure also allow selection of local patterns for focused CDU optimization. In addition, the plurality of sacrificial patterns provides systematic CD measurements of OCD and average line width measurements (ALW) by CD SEM. Furthermore, the CDU of the second layer, may be optimized with dummy patterns that provide flat areas for irregular patterns in the first layer and the CDU of the dummy grating patterns in the second layer may be optimized with the dummy grating patterns. The CDU of a specific layer, such as the second layer, may also be optimized with dummy grating patterns. For average CD measurement by CD SEM, the plurality of sacrificial patterns enable small dummy gratings to be used. With the sacrificial twin mask, intra-field CD uniformity may be optimized without the limitation of sampling size and the location of OCD patterns.

It is to be understood that the following disclosure provides different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not itself dictate a relationship between various embodiments and/or configurations discussed.

What is claimed is:

1. A method for optimizing critical dimension uniformity metrology in integrated circuit manufacturing, the method comprising:
   providing a first mask including a device pattern;
   providing a second mask including:
   the device pattern copied from the first mask;
   and a sacrificial pattern that overlaps with the device pattern copied from the first mask, the sacrificial pattern including one of: an optical critical dimension pattern and a dummy grating pattern;
   and producing an in-layer-device-pattern and an in-layer-sacrificial-pattern by performing a lithography operation using the second mask.

2. The method of claim 1, further comprising measuring critical dimension uniformity of the in-layer-sacrificial-pattern, wherein the measuring critical dimension uniformity results in measurements that approximate critical dimension uniformity of a layer of an integrated circuit produced by performing a further lithography operation using the first mask.

3. The method of claim 2, wherein the measuring critical dimension uniformity is performed as an after-development inspection.

4. The method of claim 2, wherein the measuring critical dimension uniformity is performed as an after-etching inspection.

5. The method of claim 2, wherein the measuring critical dimension uniformity includes one of using an optical critical dimension technique and using a scanning electron microscope (SEM) technique.

6. The method of claim 5, wherein the using the SEM technique includes employing a SEM average-line-width technique.

7. The method of claim 1, wherein:
   the second mask includes a plurality of additional sacrificial patterns that each include one of: an optical critical dimension pattern and a dummy grating pattern, wherein some of the plurality of additional sacrificial patterns overlap with the device pattern copied for the first mask.

8. The method of claim 7, wherein the sacrificial patterns are identical to each other, and wherein the sacrificial patterns are one of uniformly spatially distributed over the second mask and uniformly oriented relative to each other.

9. The method of claim 7, further comprising measuring critical dimension uniformity of a subset of the in-layer-sacrificial-patterns, wherein the subset of the in-layer-sacrificial-patterns represents one or more local regions of the second mask.

10. A mask for optimizing critical dimension uniformity metrology in integrated circuit manufacturing, the mask comprising:
    a device pattern copied from a production mask;
    and a sacrificial pattern that overlaps with the device pattern, the sacrificial pattern including one of: an optical critical dimension pattern and a dummy grating pattern.

11. The mask of claim 10, wherein the mask includes a plurality of additional sacrificial patterns that each include one of: an optical critical dimension pattern and a dummy grating pattern, wherein some of the additional plurality of sacrificial patterns overlap with the device pattern.

12. The mask of claim 11, wherein the sacrificial patterns are identical to each other, and wherein the sacrificial patterns are one of uniformly spatially distributed over the mask and uniformly oriented relative to each other.

13. A method for optimizing critical dimension uniformity metrology in integrated circuit manufacturing, the method comprising:
    providing a first mask including a device pattern;
    providing a second mask including:

the device pattern copied from the first mask; and a sacrificial pattern that overlaps with the device pattern copied from the first mask, the sacrificial pattern including one of: an optical critical dimension pattern and a dummy grating pattern; and performing a lithography operation using the second mask to transfer the device pattern and the sacrificial pattern from the second mask to a layer of a test-integrated-circuit.

14. The method of claim 13, further comprising:
providing a third mask including another device pattern;
providing a fourth mask including:
the another device pattern copied from the third mask; and
a flat pattern that
overlaps with the another device pattern; and
prior to the performing the lithography operation using the second mask, performing a lithography operation using the fourth mask to transfer the another device pattern and the flat pattern from the fourth mask to another layer of the test-integrated-circuit;
wherein the layer produced from the second mask overlies the another layer produced from the fourth mask such that the sacrificial pattern directly overlies the flat pattern.

15. The method of claim 14, wherein the sacrificial pattern is: a same size and shape as the flat pattern; and oriented uniformly relative to the flat pattern.

16. The method of claim 14, further comprising measuring critical dimension uniformity of the sacrificial pattern formed in the layer of the test-integrated circuit;
wherein the measuring the critical dimension uniformity results in measurements that approximate critical dimension uniformity of an upper production layer produced by performing a lithography operation using the first mask; and
wherein the upper production layer is disposed above a lower production layer produced by performing a lithography operation using the third mask.

17. The method of claim 16, wherein the measuring critical dimension uniformity is performed as one of an after-development inspection and an after-etching inspection.

18. The method of claim 14, wherein the second mask includes a plurality of additional sacrificial patterns, wherein some of the additional sacrificial patterns overlap with the device pattern copied from the first mask;
wherein the fourth mask includes a plurality of flat patterns, wherein some of the flat patterns overlap with the another device pattern copied from the third mask; and
wherein each of the plurality of additional sacrificial patterns directly overlies each of the plurality of flat patterns.

* * * * *